US008643097B2

(12) United States Patent
Liu et al.

(10) Patent No.: US 8,643,097 B2
(45) Date of Patent: Feb. 4, 2014

(54) TRENCH-GATE METAL OXIDE SEMICONDUCTOR DEVICE AND FABRICATING METHOD THEREOF

(75) Inventors: Kuan-Ling Liu, Chiayi County (TW); Shih-Yuan Ueng, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 174 days.

(21) Appl. No.: 13/205,767

(22) Filed: Aug. 9, 2011

(65) Prior Publication Data
US 2013/0037880 A1 Feb. 14, 2013

(51) Int. Cl.
*H01L 29/78* (2006.01)
*H01L 29/76* (2006.01)

(52) U.S. Cl.
USPC ........... 257/331; 257/270; 257/330; 257/342; 257/E21.41; 257/E29.262; 438/341; 438/386; 438/488

(58) Field of Classification Search
USPC ................. 257/270, 330, 331, 342, E21.41, 257/E29.262; 438/341, 386, 488
See application file for complete search history.

(56) References Cited

U.S. PATENT DOCUMENTS

| 6,610,577 | B1 | 8/2003 | Thomas et al. | |
| 7,015,115 | B1 | 3/2006 | Yin et al. | |
| 2002/0158277 | A1* | 10/2002 | Harada et al. | 257/288 |
| 2004/0021173 | A1* | 2/2004 | Sapp | 257/330 |
| 2008/0197407 | A1* | 8/2008 | Challa et al. | 257/330 |
| 2010/0159669 | A1 | 6/2010 | Lee | |

\* cited by examiner

*Primary Examiner* — Dao H Nguyen
(74) *Attorney, Agent, or Firm* — WPAT, PC; Justin King

(57) ABSTRACT

A trench-gate metal oxide semiconductor device includes a substrate, a first gate dielectric layer, a first gate electrode and a first source/drain structure. The substrate has a first doping region, a second doping region and at least one trench. A P/N junction is formed between the first doping region and the second doping region. The trench extends from a surface of the substrate to the first doping region through the second doping region and the P/N junction. The first gate dielectric layer is formed on a sidewall of the second trench. The first gate electrode is disposed within the trench. A height difference between the top surface of the first gate electrode and the surface of the substrate is substantially smaller than 1500 Å. The first source/drain structure is formed in the substrate and adjacent to the first gate dielectric layer.

6 Claims, 9 Drawing Sheets

TRENCH-GATE METAL OXIDE SEMICONDUCTOR DEVICE AND FABRICATING METHOD THEREOF

FIELD OF THE INVENTION

The present invention relates to a semiconductor device and a fabricating method thereof, and more particularly to a trench-gate metal oxide semiconductor device and a fabricating method thereof.

BACKGROUND OF THE INVENTION

A trench-gate metal oxide semiconductor (TMOS) field effect transistor is a semiconductor device whose gate structure is embedded in the etch trench of the epitaxial layer. Since the carrier drift path of such field effect transistor is formed along the sidewall of the trench, the channel length of the field effect transistor can be largely increased and the resistance of the characteristic channel can be largely reduced by about 30%. Therefore, if the operating current is constant, the static power loss is reduced and the device current density is increased. As known, the conventional planar channel field effect transistor fails to simultaneously increase device current density and reduce the on-resistance. However, the trench-gate metal oxide semiconductor field effect transistor can achieve these purposes. As the feature size and the wiring space are gradually reduced, the trench-gate metal oxide semiconductor field effect transistor becomes more important.

However, since the integrated circuit becomes more and more complicated, the development of the trench-gate metal oxide semiconductor field effect transistor is limited. For complying with the demands on the increasing integration and diversified functions of the integrated circuit and reducing the fabricating cost, there is a need of integrating the structures and the producing processes of the trench-gate metal oxide semiconductor device and the planar channel metal oxide semiconductor device.

SUMMARY OF THE INVENTION

In accordance with an aspect, the present invention provides a trench-gate metal oxide semiconductor device. The trench-gate metal oxide semiconductor device includes a substrate, a first gate dielectric layer, a first gate electrode and a first source/drain structure. The substrate has a first doping region, a second doping region and at least one trench. A P/N junction is formed between the first doping region and the second doping region. The trench extends from a surface of the substrate to the first doping region through the second doping region and the P/N junction. The first gate dielectric layer is formed on a sidewall of the second trench. The first gate electrode is disposed within the trench and has a top surface. A height difference between the top surface of the first gate electrode and the surface of the substrate is substantially smaller than 1500 Å. The first source/drain structure is formed in the substrate and adjacent to the first gate dielectric layer.

In an embodiment, the trench-gate metal oxide semiconductor device further includes a dielectric capping layer for covering the top surface of the first gate electrode.

In an embodiment, the first doping region is an N-type well region extending from the surface of the substrate into the substrate, and the second doping region is a P-type well region extending from the surface of the substrate to the N-type well region.

In an embodiment, the substrate further includes an N-type buried layer and a P-type epitaxial layer. The P-type epitaxial layer is formed over the buried layer. The N-type well region extends from the surface of the substrate to the P-type epitaxial layer.

In an embodiment, the first source/drain structure is an N-type doping structure extending from the surface of the substrate to the P-type well region along the sidewall of the trench.

In an embodiment, the trench-gate metal oxide semiconductor device further includes a third doping region, a second gate dielectric layer, a second gate electrode and a second source/drain structure. The third doping region is formed in the substrate and separated from the first doping region, wherein the third doping region and the first doping region have the same polarity. The second gate dielectric layer is formed on the surface of the substrate corresponding to the third doping region. The second gate electrode is formed on the second gate dielectric layer. The second source/drain structure is formed in the third doping region and adjacent to the second gate dielectric layer, wherein the second source/drain structure and the second doping region have the same polarity.

In accordance with another aspect, the present invention provides a fabricating method of a trench-gate metal oxide semiconductor device. The fabricating method includes the steps of defining a first zone and a second zone in a substrate, forming at least one first trench in the second zone, forming a dielectric layer on the first zone and the second zone, filling the dielectric layer in the first trench, performing an etching process to form at least one second trench in the first zone by using the dielectric layer as an etching mask, forming a first gate dielectric layer on a sidewall of the second trench, and filling a conducting material layer into the second trench, thereby forming a first gate electrode.

In an embodiment, before or after the step of forming the second trench, the fabricating method further includes a step of forming a first source/drain structure in the first zone.

In an embodiment, the dielectric layer is formed by a chemical vapor deposition process, and the conducting material layer is made of poly-silicon.

In an embodiment, after the step of filling the conducting material layer, the fabricating method further includes steps of forming a flat layer to cover the conducting material layer, performing a chemical mechanical polishing process to remove the flat layer and a portion of the conducting material layer, and performing a blanket etching process to remove the conducting material layer and the dielectric layer overlying the first zone and the second zone.

In an embodiment, after the conducting material layer and the dielectric layer overlying the first zone and the second zone are removed, the fabricating method further includes steps of forming a second gate dielectric layer over the second zone, forming a second gate electrode on the second gate dielectric layer, and forming a second source/drain structure in the second zone.

In an embodiment, before the step of forming the second source/drain structure, the fabricating method further comprises a step of covering a dielectric capping layer on the first gate electrode.

In accordance with a further aspect, the present invention provides a fabricating method of a trench-gate metal oxide semiconductor device. The fabricating method includes the steps of defining a first zone and a second zone in a substrate, forming a patterned hard mask layer over the first zone and the second zone, performing an etching process to form at least one trench in the first zone by using the patterned hard mask layer as an etch mask, forming a first gate dielectric layer on a sidewall of the trench, and filling a conducting material layer into the trench, thereby forming a first gate electrode.

In an embodiment, before the step of forming the patterned hard mask layer, the fabricating method further includes steps of forming at least one isolation structure in the second zone.

In an embodiment, the isolation structure is a shallow trench isolation layer, and the conducting material layer is made of poly-silicon.

In an embodiment, the patterned hard mask layer is a multi-layered structure including a silicon oxide thin film layer and a silicon nitride thick film layer, or the patterned hard mask layer is a multi-layered structure including a silicon oxide thick film layer and a silicon nitride thin film layer.

In an embodiment, after the step of filling the conducting material layer, the fabricating method further includes steps of forming a flat layer to cover the conducting material layer, performing a chemical mechanical polishing process to remove the flat layer and a portion of the conducting material layer, and performing a blanket etching process to remove the conducting material layer and the patterned hard mask layer overlying the first zone and the second zone.

In an embodiment, after the conducting material layer and the patterned hard mask layer overlying the first zone and the second zone are removed, the fabricating method further includes steps of forming a second gate dielectric layer over the second zone, forming a second gate electrode on the second gate dielectric layer, and forming a second source/drain structure in the second zone.

In an embodiment, before the step of forming the second source/drain structure, the fabricating method further includes a step of covering a dielectric capping layer on the first gate electrode.

In the above embodiments, the present invention integrates the production process of the trench-gate metal oxide semiconductor device and the production process of the planar channel gate metal oxide semiconductor device, thereby fabricating a complementary metal-oxide-semiconductor device with the trench-gate metal oxide semiconductor structure and the planar channel gate metal oxide semiconductor structure.

In some embodiments, the shallow trench isolation process for fabricating the planar channel gate metal oxide semiconductor device and the trench etch process for fabricating the trench-gate metal oxide semiconductor device may be integrated. In such way, the dielectric layer for forming the shallow trench isolation structure is changed to be used as the etching mask for forming the trench. Consequently, the technology of the present invention has many benefits such as cost-effectiveness, high integration of semiconductor process and structure, and reduced fabricating cost.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
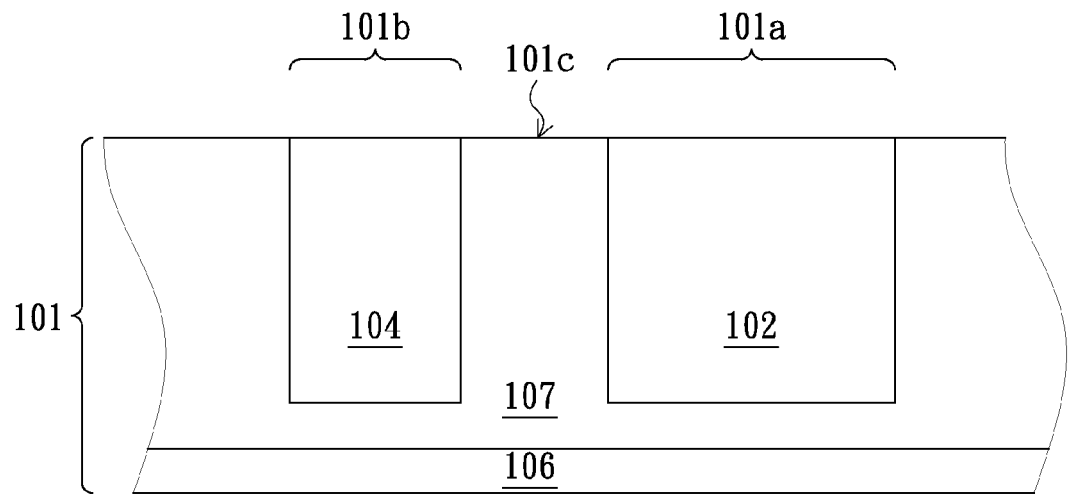
FIGS. 1A~1I are schematic cross-sectional views illustrating a method for fabricating a CMOS device according to an embodiment of the present invention.
Figure 1B:
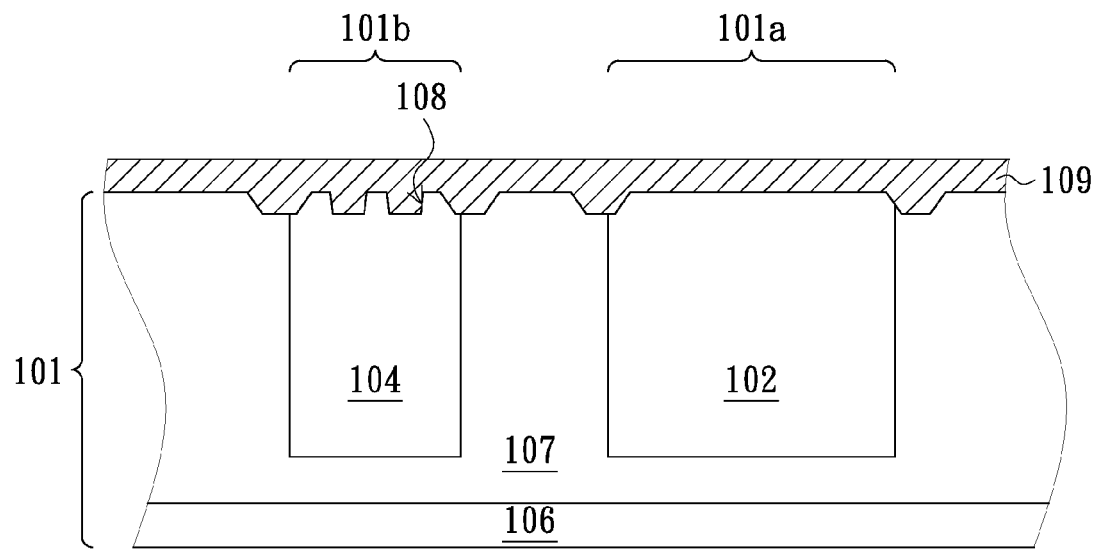
Figure 1C:
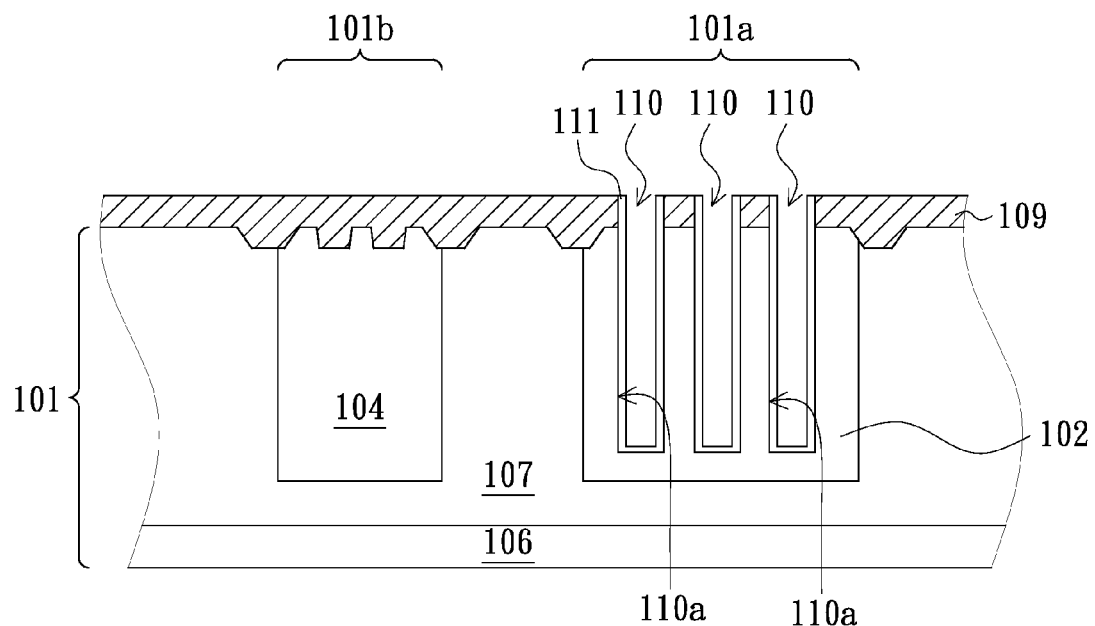

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

The present invention provides an improved trench-gate metal oxide semiconductor device and a fabricating method of the trench-gate metal oxide semiconductor device. In accordance with a key feature of the present invention, two metal oxide semiconductor structures with a planar channel and a vertical channel are integrated, so that the fabricating cost is reduced.

FIGS. 1A~1I are schematic cross-sectional views illustrating a method for fabricating a complementary metal-oxide-semiconductor (CMOS) device 100 according to an embodiment of the present invention. The method for fabricating the CMOS device comprises the following steps:

Firstly, a first zone 101a and a second zone 101b are defined in a substrate 101. In some embodiments, the first zone 101a and the second zone 101b are defined in the substrate 101 by a series of ion-implanting processes. According to the functional requirements of the transistor devices, two separate doping regions are formed in the substrate 101. For example, the first zone 101a comprises a first doping region 102. The second zone 101b comprises a third doping region 104, which is separated from the first doping region 102 (see FIG. 1A).

The polarity type of the third doping region 104 is selective and determined depending upon the functional requirements of the two transistor devices respectively formed on the first zone 101a and the second zone 10 1b. If the two transistor devices require identical function, they shall have the same polarity type, otherwise if the functional requirements of the two transistor devices are different, the polarity type of the two transistor devices are different. In other words, the polarity type of the third doping region 104 may be identical to or different from that of the first doping region 102.

In this embodiment, the third doping region 104 and the first doping region 102 have the same polarity. According to the polarity, the doping regions may be classified into two types, i.e. P-type doping regions and N-type doping regions. Depending on the type of the implanted dopant such as boron ion (B+) and phosphorous ion (P+) or arsenic ion (As+) and antimony ion (Sb+), the semiconductor region will have a positive polarity (i.e. the transport carrier is hole) or a negative polarity (i.e. the transport carrier is electron) and thus the polarity type of the doping region is determined. It is noted that the polarities of various devices are presented herein for purpose of illustration and description only.

For example, in this embodiment, the substrate 101 has an N-type buried layer 106 and a P-type epitaxial layer 107 overlying the buried layer 106. The first doping region 102 is an N-type well region extending from a substrate surface 101c to the P-type epitaxial layer 107. The third doping region 104 is another N-type well region extending from the substrate surface 101c to the P-type epitaxial layer 107. The third doping region 104 and the first doping region 102 are separated from each other by the P-type epitaxial layer 107 of the substrate 101.

Then, at least one first trench 108 is formed in the second zone 101b. In an embodiment, the step of forming the first trench 108 includes the sub-steps of growing a pad silicon oxide layer and a silicon nitride layer (not shown) on the substrate surface 101c, and performing a photolithography and etching process to shallow-trench etch the pad silicon oxide layer, the silicon nitride layer and the substrate 101 sequentially to form at least one shallow trench. After the at least one first trench 108 is formed, a dielectric layer 109 is formed over the first zone 101a and the second zone 101b of the substrate 101 and filled in the first trench 108 (see FIG. 1B). For example, the dielectric layer 109 is a deposited oxide layer formed by a chemical vapor deposition process.

Then, by using the dielectric layer 109 serving as an etching hard mask, an etching process is performed to form at least one second trench 110 in the first zone 101a. The second trench 110 is substantially vertical to the substrate surface 101c. Then, a first gate dielectric layer 111 is formed on the sidewall 110a of the second trench 110 (see FIG. 1C). In some embodiments, prior to the step of forming the first gate dielectric layer 111, a sacrificial oxide layer (not shown) is formed on the sidewall 110a of the second trench 110 to repair the damaged sidewall 110a resulting from the etching process. After the sacrificial oxide layer is removed, the first gate dielectric layer 111 is formed on the sidewall 110a and the bottom of the second trench 110 by a chemical vapor deposition process, thermal oxidation process or other suitable processes. Preferably, the first gate dielectric layer 111 is made of silicon dioxide.

Figure 1D:
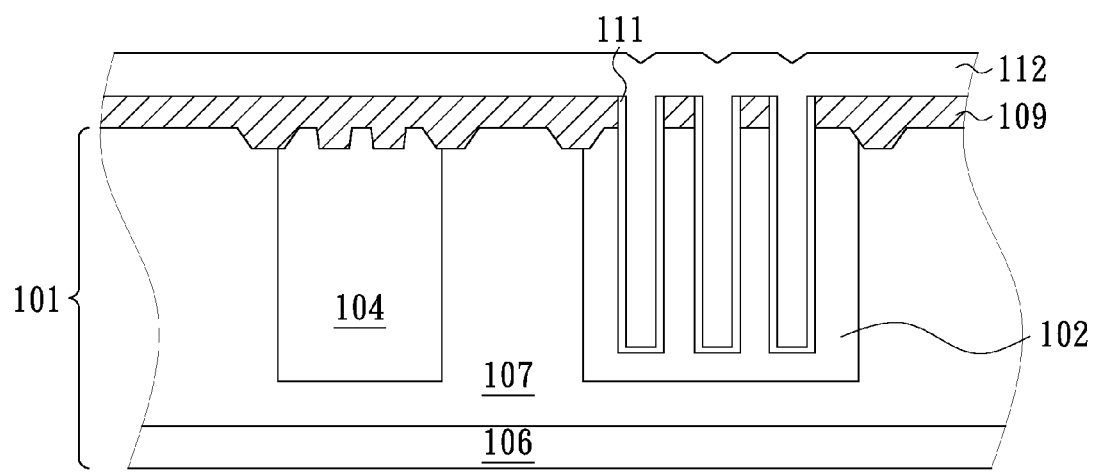
Figure 1E:
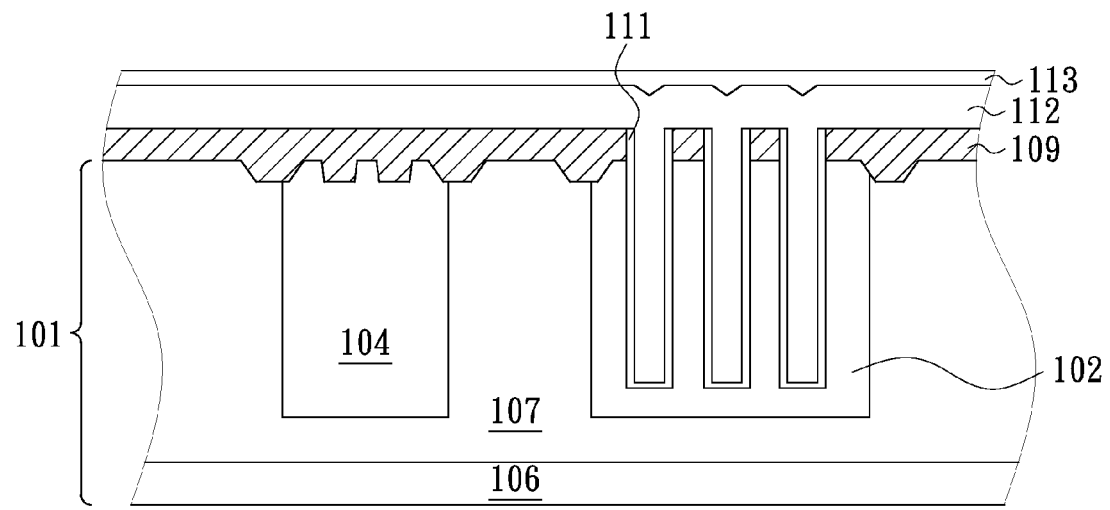
Figure 1F:
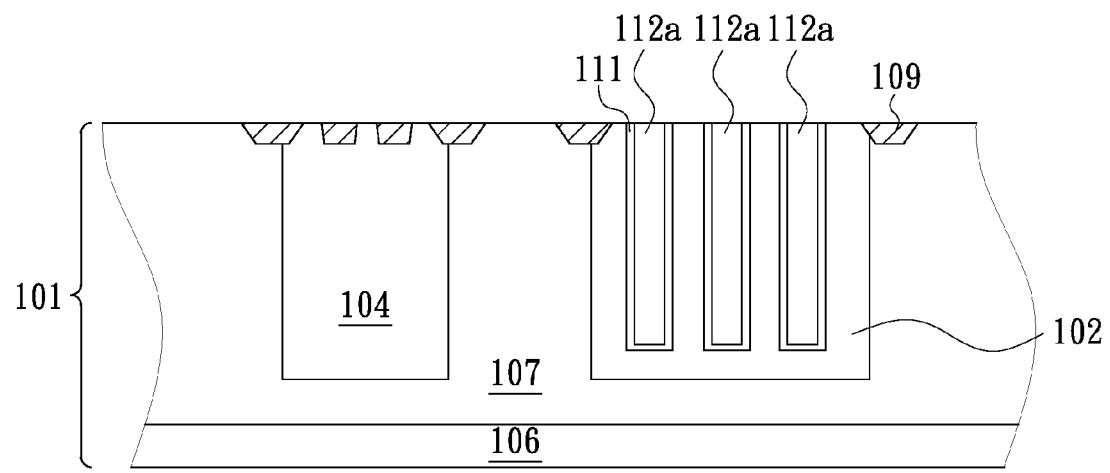
Figure 1G:
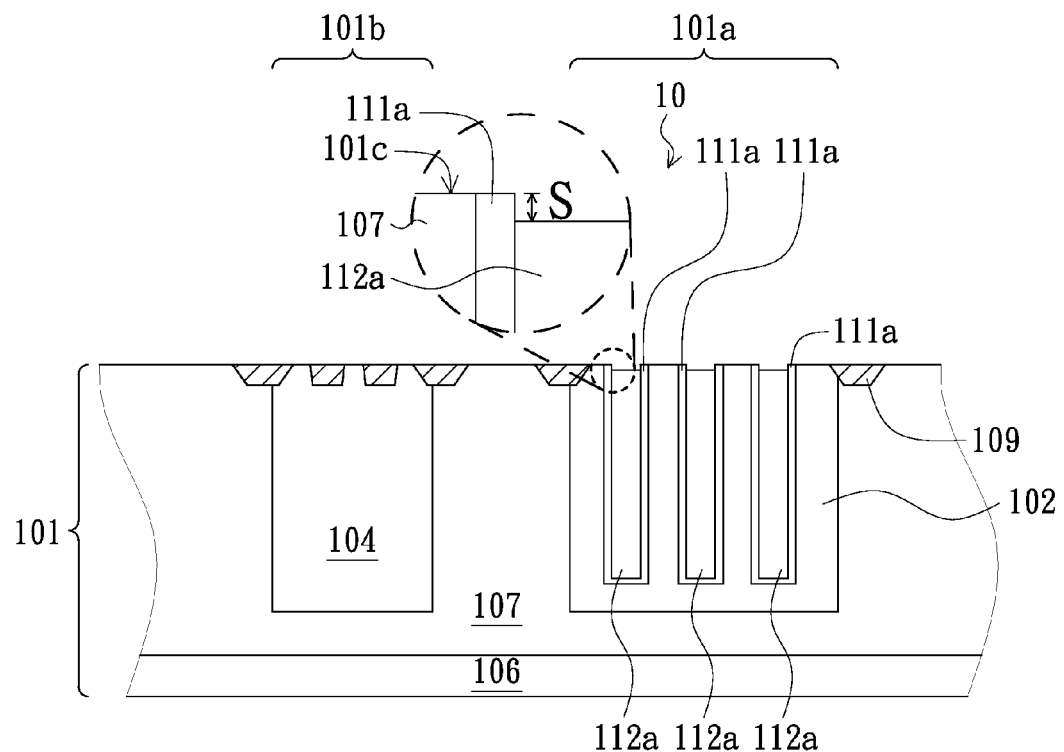

Then, a conducting material layer 112 is filled into the second trench 110 (see FIG. 1D). In some embodiments, the conducting material layer 112 is made of poly-silicon. The conducting material layer 112 is formed on the first gate dielectric layer 111 and filled in the second trench 110 by a deposition process.

After the step of filling the conducting material layer 112 is performed, the conducting material layer 112 is subject to a flattening process. For example, a flat layer 113 (e.g. a silicon dioxide layer) is formed on the conducting material layer 112 to cover the conducting material layer 112 (see FIG. 1E). Then, a flattening process (e.g. a chemical mechanical polishing process) is performed to remove the flat layer 113 and a portion of the dielectric layer 109 and the conducting material layer 112, so as to expose the substrate surface 101c. (see FIG. 1F).

Then, a selective etching process is performed to remove a portion of the conducting material layer 112 filled in the second trench 110. At the same time, a portion of the first gate dielectric layer 111 and a portion of conducting material layer 112 within the second trench 110 are retained. In the subsequent process of producing a trench-gate metal oxide semiconductor field effect transistor 10, the portion of the first gate dielectric layer 111 and the portion of conducting material layer 112 within the second trench 110 are respectively severed as a vertical gate oxide layer 111a and a vertical gate electrode 112a of the subsequently-formed trench-gate metal oxide semiconductor field effect transistor 10 (see FIG. 1G).

However it should be appreciated that, the flat layer 113 is optional. Because it is merely used to fulfill the recess resulted from the gap filling process of the conducting material layer 112 and serves as a buffer layer for the chemical mechanical polishing process. Accordingly, in some other embodiments of the present invention, the chemical mechanical polishing process may be carried out directly to remove the dielectric layer 109 and the conducting material layer 112 without forming the flat layer 113. Besides, in some further embodiments, after the flat layer 113 is formed a selective etching process may be directly performed to remove the dielectric layer 109 and the conducting material layer 112 rather than performing the chemical mechanical polishing process.

Since the selective etching process is helpful to control the removing of the conducting material layer 112. Therefore, a height difference S between the top surface of the vertical gate electrode 112a and the substrate surface 101c may be precisely controlled to be substantially smaller than 1500 Å.

After the conducting material layer 112 and the first gate dielectric layer 111 overlying the substrate surface 101c are removed, a series of ion-implanting processes are performed to define a second doping region 103 in the first zone 101a of the substrate 101. In some embodiments, the second doping region 103 is a P-type well region extending from the substrate surface 101c to the first doping region 102 (i.e. the N-type well region).

Figure 1H:
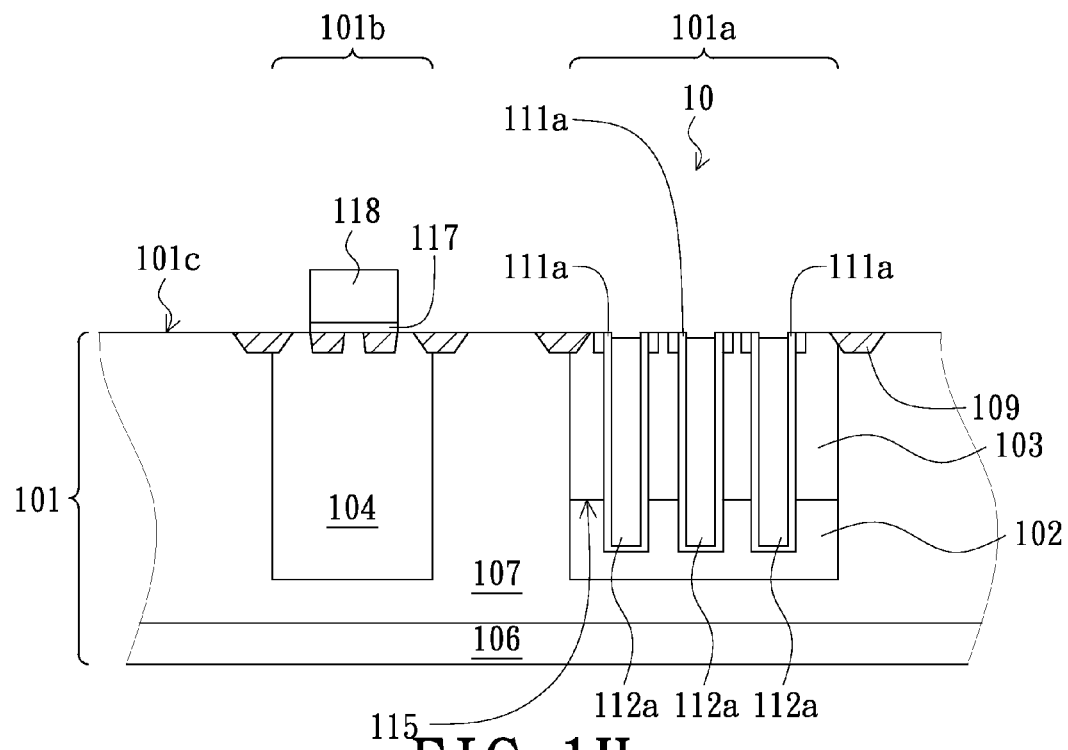
Figure 1I:
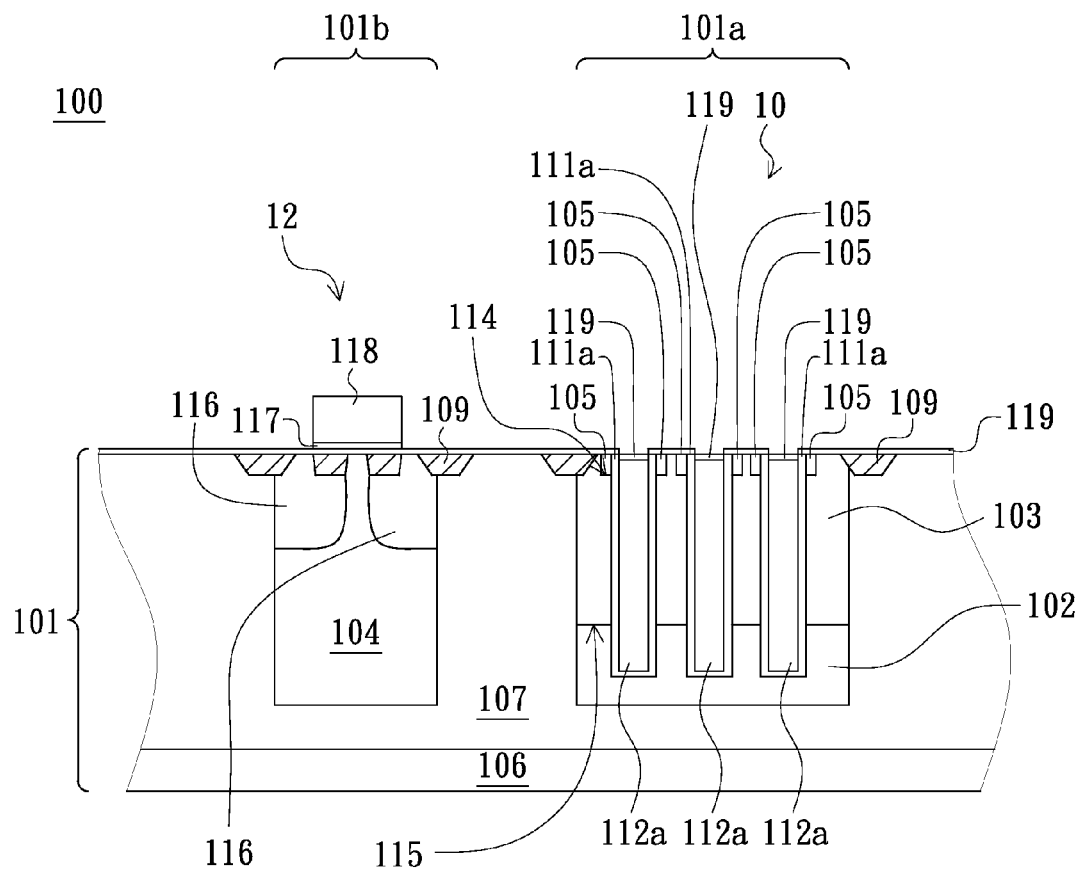

Then, a second gate dielectric layer 117 is formed on the substrate surface 101c of the second zone 101b and a second gate electrode 118 is formed on the second gate dielectric layer 117 (see FIG. 1H). Next, another ion-implanting process is performed to form a plurality of (at least one) fourth doping regions 105 in the second doping region 103, wherein the fourth doping region 105 is an N-type doping structure having a higher N-type dopant concentration and extending from the substrate surface 101c of the first zone 101a to the first doping region 102 along the sidewall 110a of the second trench 110. The fourth doping region 105 is adjacent to the vertical gate oxide layer 111a and surrounded by the second doping region 103 (i.e. a P-type well region).

Thereafter another series of ion-implanting processes are performed to dope the second zone 101b by using the second gate electrode 118 and the second gate dielectric layer 117 serving as a mask, so as to define a second source/drain structure 116 of a planar channel gate metal oxide semiconductor field effect transistor 12 adjacent to the second gate dielectric layer 117 and the second gate electrode 118. Meanwhile, the planar channel gate metal oxide semiconductor field effect transistor 12 is produced (see FIG. 1I). In this embodiment, the second source/drain structure 116 includes two P-type doping structures, which are separated from each other and respectively extend from the substrate surface 101c to the third doping region 104 (i.e. the N-type well region).

Please refer to FIG. 1I again. A P/N junction 115 is formed at an interface between the second doping region 103 and the first doping region 102. The fourth doping region 105 and the first doping region 102 have the same polarity. Moreover, another P/N junction 114 is formed at an interface between the fourth doping region 105 and the second doping region 103. Consequently, the fourth doping region 105 and the first doping region 102 respectively serve as the source region and the drain region (referred hereinafter as a first source/drain structure) of the trench-gate metal oxide semiconductor field effect transistor 10 and the second doping region 103 disposed between the first doping region 102 and the fourth doping region 105 serves as the channel of the trench-gate metal oxide semiconductor field effect transistor 10. In other words, channel length of the trench-gate metal oxide semiconductor field effect transistor 10 may be determined by the doping deepness of the second doping region 103.

In the above embodiment, the ion-implanting processes for defining the second doping region 103 and the fourth doping regions 105 are performed after the step of forming the second trench 110. Alternatively, in some embodiments, the ion-implanting processes for defining the second doping region 103 and the fourth doping regions 105 are performed immediately after the step of forming the first gate dielectric layer 111; and after the first source/drain structure are formed, an etching process is performed to form the second trench 110 in the first zone 101a. Except for the implementing sequences, the steps of the above two embodiments are similar to each other, and are not redundantly described herein.

In some embodiments, before the step of forming the second source/drain structure 116 of the planar channel gate metal oxide semiconductor field effect transistor 12, an optional dielectric capping layer 119 is formed to cover the planar channel gate metal oxide semiconductor field effect transistor 12 and the trench-gate metal oxide semiconductor field effect transistor 10 (see FIG. 1I), wherein materials consisting of the dielectric capping layer 119 may be silicon oxide, silicon nitride and the like. The use of the dielectric capping layer 119 can protect the conducting material layer 112 (e.g. poly-silicon) filled within the second trench 110 from being damaged in the subsequent process of forming the planar channel gate metal oxide semiconductor field effect transistor 12. In such way, the channel length of the first gate dielectric layer 111 can be controlled more precisely.

Then, the semiconductor back-end process (not shown) is performed to integrate the planar channel gate metal oxide semiconductor field effect transistor 12 and the trench-gate metal oxide semiconductor field effect transistor 10 into a complementary metal-oxide-semiconductor (CMOS) device 100.

FIGS. 2A~2H are schematic cross-sectional views illustrating a method for fabricating a CMOS device 200 according to another embodiment of the present invention. The method for fabricating the CMOS device comprises the following steps.

Firstly, a first zone 201a and a second zone 201b are defined in a substrate 201. In some embodiments, the first zone 201a and the second zone 201b are defined in the substrate 201 by a series of ion-implanting processes. According to the functional requirements of the transistor devices, two separate doping regions are formed in the substrate 201. For example, the first zone 201a comprises a first doping region 202. The second zone 201b comprises a third doping region 204 (see FIG. 2A). The third doping region 204 and the first doping region 202 have the same polarity.

In this embodiment, the substrate 201 has an N-type buried layer 206 and a P-type epitaxial layer 207 overlying the buried layer 206. The first doping region 202 is an N-type well region extending from a substrate surface 201c to the P-type epitaxial layer 207. The third doping region 204 is another N-type well region extending from the substrate surface 201c to the P-type epitaxial layer 207. The first doping region 202 and the third doping region 204 are separated from each other by the P-type epitaxial layer 207 of the substrate 201.

Then, at least one isolation structure 208 is formed in the second zone 201b. In this embodiment, the isolation structure 208 is a shallow trench isolation layer. In an embodiment, the step of forming the isolation structure 208 includes the sub-steps of growing a pad silicon oxide layer and a silicon nitride layer (not shown) on the substrate surface 201c, and performing a photolithography and etching process to shallow-trench etch the pad silicon oxide layer, the silicon nitride layer and the substrate 201 sequentially to form at least one shallow trench. After the at least one trench is formed, a dielectric layer is filled in the trench and a flattening process is carried out on the dielectric layer to form the isolation structure 208 (see FIG. 2B).

Then, a series of ion-implanting processes are performed to define a second doping region in the first zone 201a of the substrate 201. In some embodiments, the second doping region 203 is a P-type well region extending from the substrate surface 201c to the first doping region 202 (i.e. the N-type well region) (see FIG. 2C).

Then, a patterned hard mask layer 220 is formed on the substrate 201 to cover the first zone 201a and the second zone 201b, wherein a portion of the substrate surface 201c of the first zone 201a is exposed. In this embodiment, the patterned hard mask layer 220 is a multi-layered structure including a silicon oxide thin film layer and a silicon nitride thick film layer. Alternatively, in some embodiments, the patterned hard mask layer 220 is a multi-layered structure including a silicon oxide thick film layer and a silicon nitride thin film layer. In an embodiment, the step of forming the patterned hard mask layer 220 includes the sub-steps of performing a deposition process to form a silicon oxide thin film layer 220a on the substrate 201, performing another deposition process by using tetraethyl orthosilicate as the precursor to form a silicon nitride thick film layer 220b on the silicon oxide thin film layer 220a, and then patterning the silicon oxide thin film layer 220a and the silicon nitride thick film layer 220b to expose a portion of the substrate surface 201c of the first zone 201a (see FIG. 2D).

Then, by using the patterned hard mask layer 220 as an etch mask, an etching process is performed to form at least one trench 210 in the first zone 201a. Then, a first gate dielectric layer 211 is formed on the sidewall 210a of the trench 210 (see FIG. 2E). In some embodiments, prior to the step of forming the first gate dielectric layer 211, a sacrificial oxide layer (not shown) is formed on the sidewall 210a of the second trench 210 to repair the damaged sidewall 210a resulting from the etching process. After the sacrificial oxide layer is removed, the first gate dielectric layer 211 is formed on the sidewall 210a and the bottom of the trench 210 by a chemical vapor deposition process, a thermal oxidation process or other suitable processes. Preferably, the first gate dielectric layer 211 is made of silicon dioxide.

Then, a conducting material layer 212 is filled in the trench 210. In some embodiments, the conducting material layer 212 is made of poly-silicon. The conducting material layer 212 is formed on the first gate dielectric layer 211 and filled in the trench 210 by a deposition process.

After the step of filling the conducting material layer 212 is performed, the conducting material layer 212 is subject to a flattening process.

Figure 2A:
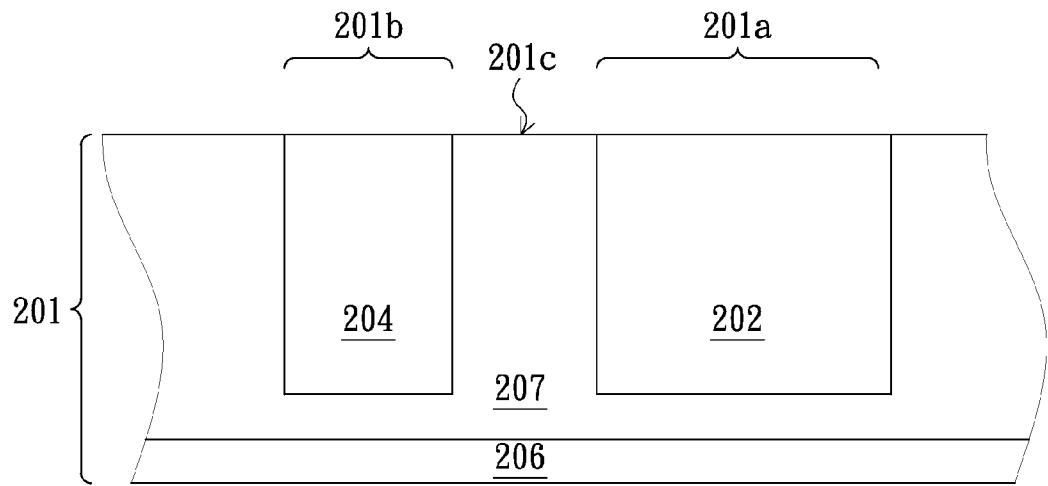
FIGS. 2A~2H are schematic cross-sectional views illustrating a method for fabricating a CMOS device according to another embodiment of the present invention.
Figure 2B:
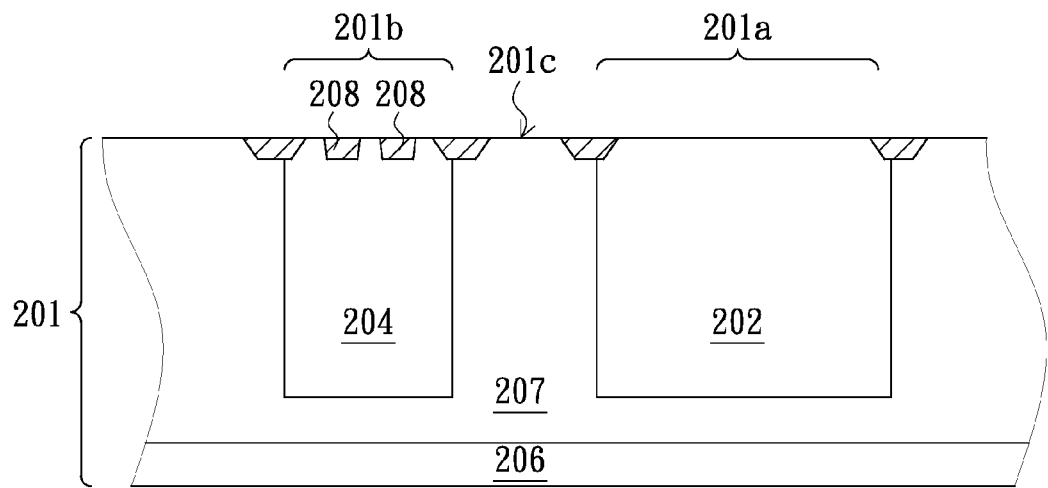
Figure 2C:
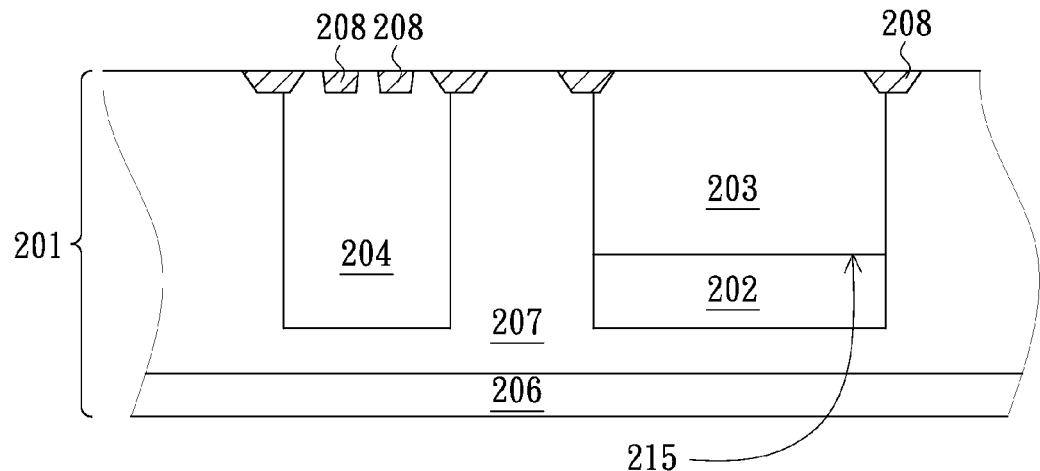
Figure 2D:
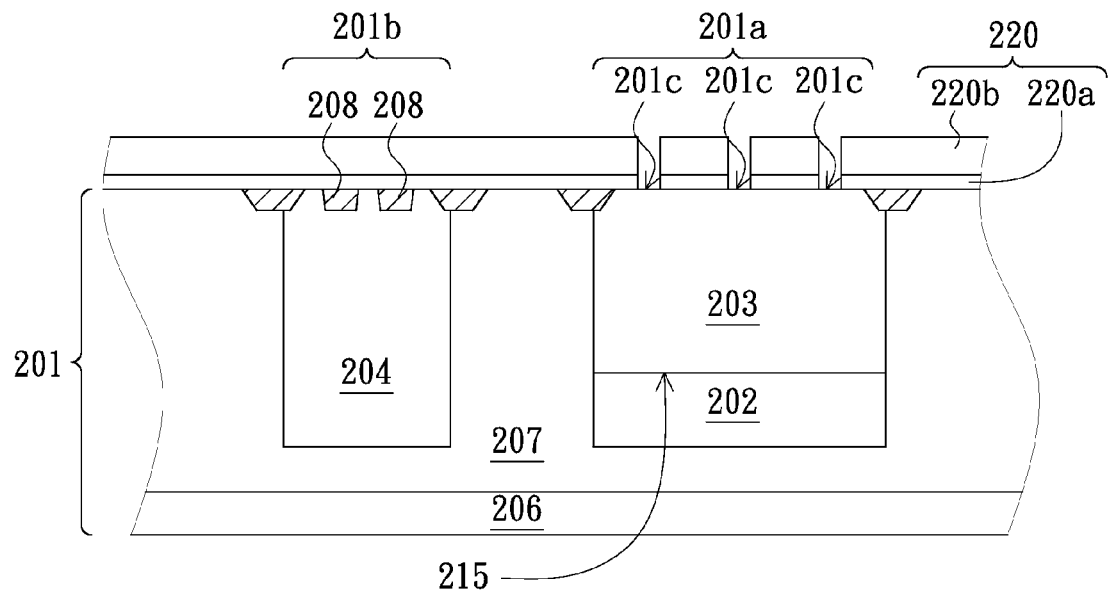
Figure 2E:
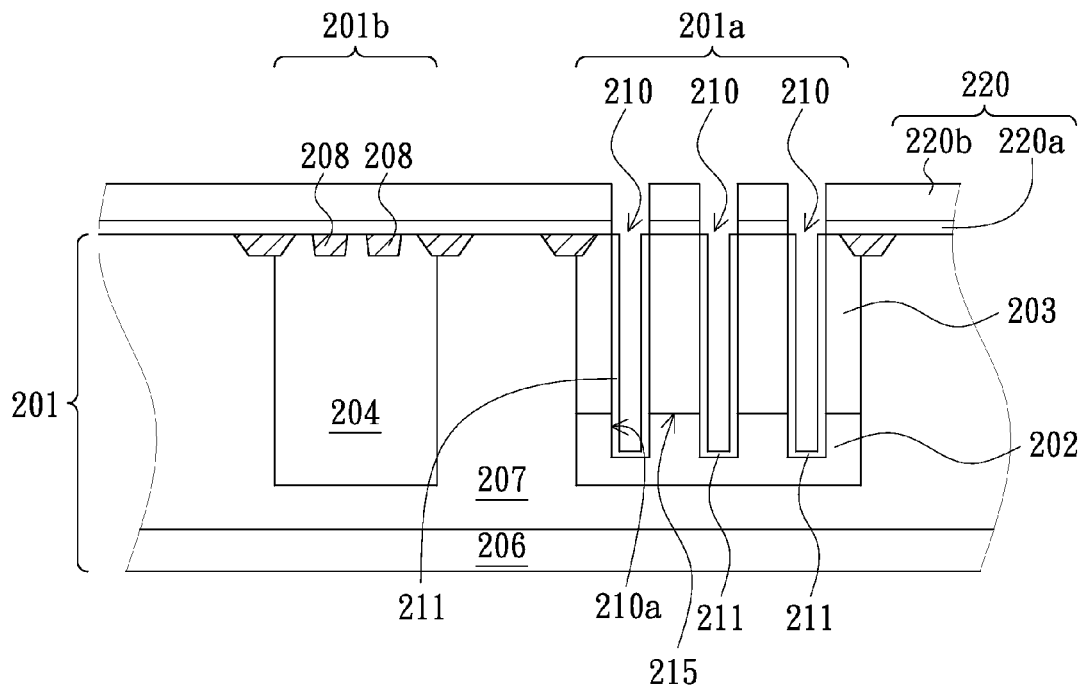
Figure 2F:
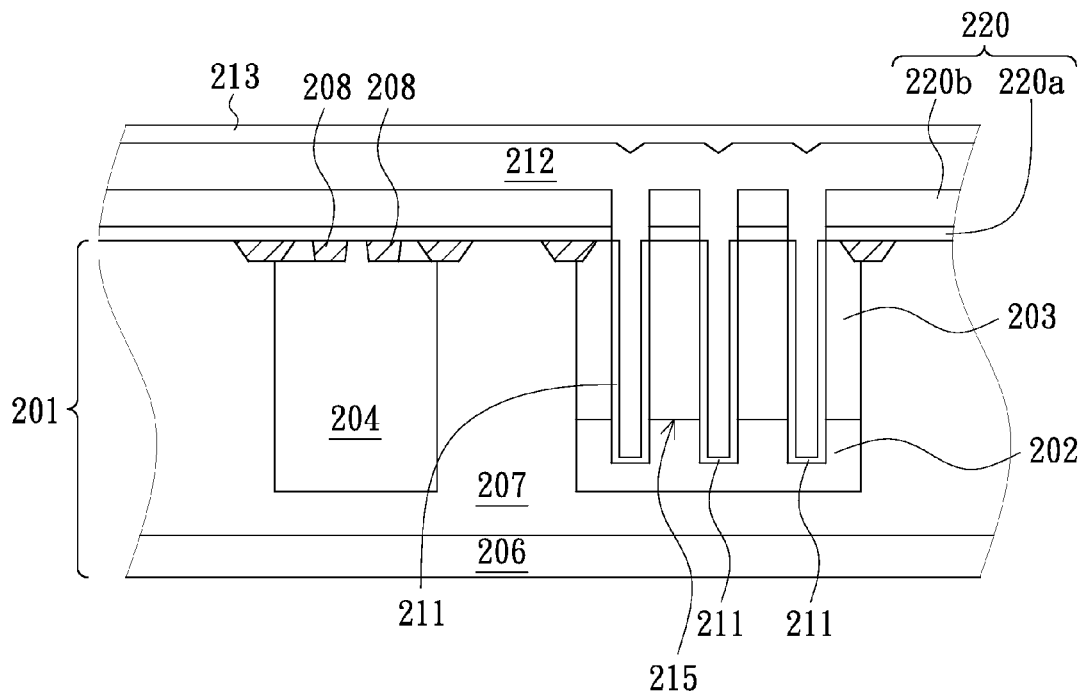

For example, an optional flat layer 213 (e.g. a silicon dioxide layer) is formed on the conducting material layer 212 to cover the conducting material layer 212 (see FIG. 2F). Then, the flattening process (e.g. a chemical mechanical polishing) process is performed to remove the flat layer 213, the patterned hard mask layer 220, and a portion of the conducting material layer 212 and to expose the substrate surface 201c.

Figure 2G:
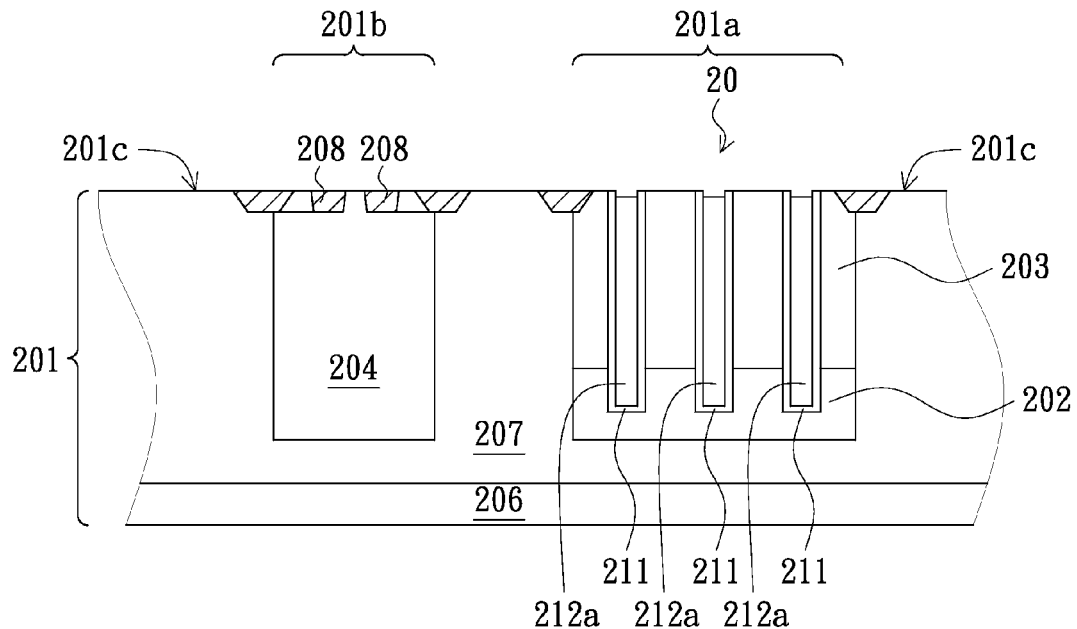

Then, a selective etching process is performed to remove a portion of the conducting material layer filled in the trench 210 Meanwhile, a portion of the first gate dielectric layer 211 and a portion of conducting material layer 212 within the second trench 210 are retained and a trench-gate metal oxide semiconductor field effect transistor 20 is produced (see FIG. 2G).

However it should be appreciated that, the flat layer 213 is optional. Because it is merely used to fulfill the recess resulted from the gap filling process of the conducting material layer 212 and serves as a buffer layer for the chemical mechanical polishing process. Accordingly, in some other embodiments of the present invention, the chemical mechanical polishing process may be carried out directly to remove the patterned hard mask layer 220 and the conducting material layer 212 without forming the flat layer 213. Besides, in some further embodiments, after the flat layer 213 is formed a selective etching process may be directly performed to remove the patterned hard mask layer 220 and the conducting material layer 212 rather than performing the chemical mechanical polishing process.

The portion of conducting material layer 212 remained within the trench 210 serves as a vertical gate electrode 212a of the trench-gate metal oxide semiconductor field effect transistor 20. The first gate dielectric layer 211 on the sidewall 210a of the trench 210 serves as a vertical gate oxide layer 211a of the trench-gate metal oxide semiconductor field effect transistor 20.

Please refer to FIG. 2G again. A P/N junction 215 is formed at an interface between the second doping region 203 and the first doping region 202. The fourth doping region 205 and the first doping region 202 have the same polarity. Moreover, another P/N junction 214 is formed at an interface between the fourth doping region 205 and the second doping region 203. Consequently, the fourth doping region 205 and the first doping region 202 respectively serves as the source region and the drain region (referred hereinafter as a first source/drain structure) of the trench-gate metal oxide semiconductor field effect transistor 20 and the second doping region 203 disposed between the first doping region 202 and the fourth doping region 205 serves as the channel of the trench-gate metal oxide semiconductor field effect transistor 20. In other words, channel length of the trench-gate metal oxide semiconductor field effect transistor 20 may be determined by the doping deepness of the second doping region 203.

Then, an optional dielectric capping layer 219 is formed to cover the first zone 201a, the second zone 201b and the vertical gate electrode 212a of the subsequently-formed trench-gate metal oxide semiconductor field effect transistor 20.

Figure 2H:
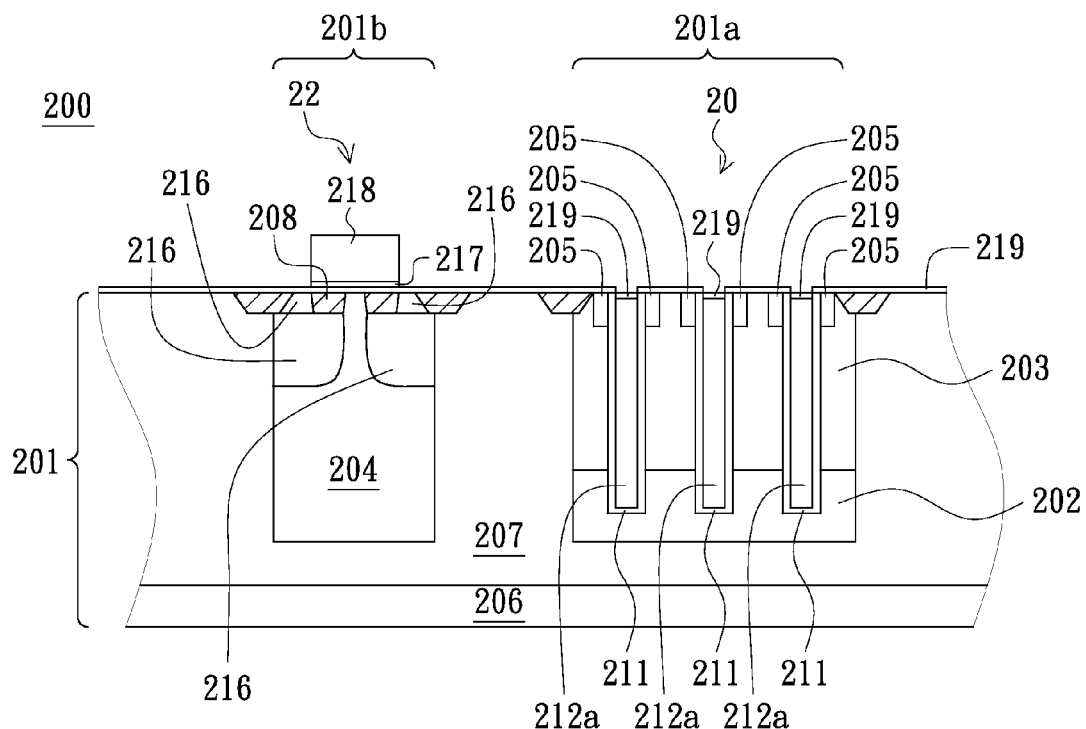

Thereafter, a second gate dielectric layer 217 is formed on the substrate surface 201c of the second zone 201b, and then a second gate electrode 218 is formed on the second gate dielectric layer 217. Next, another ion-implanting process is performed by using the gate dielectric layer 217 and the second gate electrode 218 serving as a mask to form a plurality of (at least one) fourth doping regions 205 in the second doping region 203 and simultaneously define a second source/drain structure 216 of a planar channel gate metal oxide semiconductor field effect transistor 22 in the third doping region 204. Meanwhile, the planar channel gate metal oxide semiconductor field effect transistor 22 is produced (see FIG. 2H). As shown in FIG. 2H, in the present embodiment, the fourth doping region 205 is an N-type doping structure having a higher N-type dopant concentration and extending from the substrate surface 201c of the first zone 201a to the first doping region 202, thereby the fourth doping region 205 is surrounded by the subsequently-formed second doping region 203 (i.e. a P-type well region).

Then, the semiconductor back-end process (not shown) is performed to integrate the planar channel gate metal oxide semiconductor field effect transistor 22 and the trench-gate metal oxide semiconductor field effect transistor 20 into a complementary metal-oxide-semiconductor (CMOS) device 200.

In the above embodiments, the present invention integrates the production process of the trench-gate metal oxide semiconductor device and the production process of the planar channel gate metal oxide semiconductor device, thereby fabricating a complementary metal-oxide-semiconductor device with the trench-gate metal oxide semiconductor structure and the planar channel gate metal oxide semiconductor structure.

In some embodiments, the shallow trench isolation process for fabricating the planar channel gate metal oxide semiconductor device and the trench etch process for fabricating the trench-gate metal oxide semiconductor device may be integrated. In such way, the dielectric layer for forming the shallow trench isolation structure is changed to be used as the etch stop layer for forming the trench. Consequently, the technology of the present invention has many benefits such as cost-effectiveness, high integration of semiconductor process and structure, and reduced fabricating cost.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A trench-gate metal oxide semiconductor device, comprising:
    a substrate having a first doping region, a second doping region and at least one trench, wherein a P/N junction is formed between the first doping region and the second doping region, and the trench extends from a surface of the substrate to the first doping region through the second doping region and the P/N junction;
    a first gate dielectric layer formed on a sidewall of the trench;
    a first gate electrode disposed within the trench and having a top surface, wherein the top surface of the first gate electrode is lower than the surface of the substrate, a height difference between the top surface of the first gate electrode and the surface of the substrate is substantially smaller than 1500 Å; and
    a first source/drain structure formed in the substrate and adjacent to the first gate dielectric layer.

2. The trench-gate metal oxide semiconductor device according to claim 1, further comprising a dielectric capping layer for covering the top surface of the first gate electrode.

3. The trench-gate metal oxide semiconductor device according to claim 1, wherein the first doping region is an N-type well region extending from the surface of the substrate into the substrate, and the second doping region is a P-type well region extending from the surface of the substrate to the N-type well region.

4. The trench-gate metal oxide semiconductor device according to claim 3, wherein the substrate further comprises:
    an N-type buried layer; and
    a P-type epitaxial layer formed over the buried layer, wherein the N-type well region extends from the surface of the substrate to the P-type epitaxial layer.

5. The trench-gate metal oxide semiconductor device according to claim 3, wherein the first source/drain structure is an N-type doping structure extending from the surface of the substrate to the P-type well region along the sidewall of the trench.

6. The trench-gate metal oxide semiconductor device according to claim 1, further comprising:
    a third doping region formed in the substrate and separated from the first doping region, wherein the third doping region and the first doping region have the same polarity;
    a second gate dielectric layer formed on the surface of the substrate corresponding to the third doping region;
    a second gate electrode formed on the second gate dielectric layer; and
    a second source/drain structure formed in the third doping region and adjacent to the second gate dielectric layer, wherein the second source/drain structure and the second doping region have the same polarity.

* * * * *